(12) United States Patent
Stein

(10) Patent No.: US 12,354,460 B2
(45) Date of Patent: Jul. 8, 2025

(54) SENSOR DEVICE FOR A HOT ZONE OF A VEHICLE PRODUCTION PLANT, AND ARRANGEMENT OF A SENSOR DEVICE IN A HOT ZONE OF A PRODUCTION PLANT FOR VEHICLES

(71) Applicant: Bayerische Motoren Werke Aktiengesellschaft, Munich (DE)

(72) Inventor: Daniel Stein, Leipzig (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 18/554,876

(22) PCT Filed: Mar. 15, 2022

(86) PCT No.: PCT/EP2022/056631
§ 371 (c)(1),
(2) Date: Oct. 11, 2023

(87) PCT Pub. No.: WO2022/218631
PCT Pub. Date: Oct. 20, 2022

(65) Prior Publication Data
US 2024/0378979 A1    Nov. 14, 2024

(30) Foreign Application Priority Data

Apr. 12, 2021 (DE) ...................... 10 2021 108 972.7

(51) Int. Cl.
*G08B 25/00* (2006.01)
*G08B 21/18* (2006.01)

(52) U.S. Cl.
CPC .................................. *G08B 21/18* (2013.01)

(58) Field of Classification Search
USPC ...... 340/686.1, 687, 686.6, 691.8, 3.1, 3.44, 340/5.74, 825.49, 292, 286.11, 815.62,
(Continued)

(56) References Cited

U.S. PATENT DOCUMENTS 3,873,789 A * 3/1975 Ward .................... H01H 36/00
200/332
4,117,431 A * 9/1978 Eicher ................... H01H 36/00
335/207
(Continued)

FOREIGN PATENT DOCUMENTS

DE          1997370 U      11/1968
DE     10 2007 007 478 B3    5/2008
(Continued)

OTHER PUBLICATIONS

PCT/EP2022/056631, International Search Report dated Jul. 7, 2022 (Three (3) pages).
(Continued)

*Primary Examiner* — Daniel Previl
(74) *Attorney, Agent, or Firm* — Crowell & Moring LLP

(57) ABSTRACT

A sensor device for a hot zone of a vehicle production plant includes a magnet element that is actuatable from an initial position into a deflected position when a vehicle component approaches the magnet element. An electrical circuit is open when the magnet element is arranged in the initial position and is closed when the magnet element is actuated from the initial position into the deflected position. An output element outputs a signal characterizing an ascertained approach of the vehicle component when the electrical circuit is closed.

10 Claims, 2 Drawing Sheets

(58) Field of Classification Search
USPC .................................................... 340/815.9
See application file for complete search history.

(56) References Cited

U.S. PATENT DOCUMENTS

| | | | | |
|---|---|---|---|---|
| 4,702,619 | A * | 10/1987 | Camp | G01K 7/22 |
| | | | | 374/185 |
| 4,947,759 | A * | 8/1990 | Uhl | B61L 23/34 |
| | | | | 246/194 |
| 8,176,803 | B1 * | 5/2012 | Willett | G01D 21/02 |
| | | | | 374/142 |
| 2005/0174004 | A1 * | 8/2005 | Takehara | H01F 41/028 |
| | | | | 310/156.43 |
| 2015/0039142 | A1 * | 2/2015 | LaFountain | H01H 36/0073 |
| | | | | 700/282 |
| 2015/0276315 | A1 * | 10/2015 | Schindler | F26B 23/022 |
| | | | | 34/86 |
| 2022/0009442 | A1 * | 1/2022 | Campbell | B60R 21/01546 |

FOREIGN PATENT DOCUMENTS

| | | |
|---|---|---|
| DE | 10 2011 018 430 A1 | 10/2012 |
| DE | 10 2013 108 374 A1 | 2/2015 |
| WO | WO 2013/173171 A1 | 11/2013 |

OTHER PUBLICATIONS

German Search Report issued in German application No. 10 2021 108 972.7 dated Mar. 23, 2022, with Statement of Relevancy (Eight (8) pages).

* cited by examiner

SENSOR DEVICE FOR A HOT ZONE OF A VEHICLE PRODUCTION PLANT, AND ARRANGEMENT OF A SENSOR DEVICE IN A HOT ZONE OF A PRODUCTION PLANT FOR VEHICLES

BACKGROUND AND SUMMARY

The invention relates to a sensor device for a hot zone of a vehicle production plant and to an arrangement of a sensor device in a hot zone of a production plant for vehicles.

It is already known to use inductive hot zone sensors in a hot zone of a vehicle production plant. During use in a hot zone, faults of inductive sensors may occur. If such faults of these inductive sensors occur, these sensors can only be replaced very laboriously. In the event of failure of these inductive sensors, long downtimes may occur in the production of motor vehicles. Particularly when the inductive sensors are arranged in a dryer, this dryer needs to be cooled down in order to be able to replace the inductive sensors.

DE 10 2011 018 430 A1 discloses an inductive proximity switch consisting of an electrical circuit and an evaluation device. By the electrical circuit, a coil is electrically connected in a pulsed fashion to a voltage source. A capacitor, by which an induction voltage is registered, is furthermore provided in the electrical circuit. A switching signal is generated by the evaluation device if a threshold value voltage of the capacitor is exceeded. Inductive proximity switches allow the detection of metallic objects from a relatively largely dimensioned switching distance.

Furthermore, DE 10 2013 108 374 A1 discloses a sensor unit for use in proximity to arc welding or grinding processes, comprising an inductive proximity sensor. This proximity sensor comprises a sensor housing and a front plate, which forms an active face and is configured to be nonmetallic.

It is an object of the present invention to provide a solution by means of which vehicle components can be detected reliably in a hot zone of a vehicle production plant.

The invention relates to a sensor device for a hot zone of a vehicle production plant, having a magnet element which is configured to be actuated from an initial position into a deflected position if a vehicle component approaches. In this case, the magnet element is actuated from its initial position into the deflected position in particular because of a magnetic attraction between the magnet element and the vehicle component approaching the magnet element. The magnet element is therefore actuated from its initial position into its deflected position only if the vehicle component approaches the magnet element closer than a predetermined limit distance and a magnetic force occurring between the vehicle component and the magnet element is consequently sufficient for the actuation of the magnet element from the initial position into the deflected position.

It is furthermore provided that the sensor device comprises an electrical circuit, which is open when the magnet element is arranged in the initial position and which is adapted to be closed when the magnet element is actuated from the initial position into the deflected position. In other words, the electrical circuit is closed as a consequence of the actuation of the magnet element from its initial position into its deflected position, so that electrical signal transmission in the electrical circuit is made possible, or triggered. From a flow of current through the electrical circuit, it is therefore possible to establish that the electrical circuit has been closed, so that it is in turn possible to establish that the magnet element has been actuated from its initial position into its deflected position. Via the closure of the electrical circuit, it is therefore possible to ascertain particularly easily whether the magnet element has been actuated from its initial position into its deflected position as a consequence of an approach of the vehicle component.

The sensor device furthermore comprises an output element, which is adapted to output a signal characterizing the ascertained approach of the vehicle component when the electrical circuit is closed. This means that the output of the signal by the output element is triggered by the closure of the electrical circuit. By means of the output of the signal, it is therefore possible to display particularly simply, and in a way which persons can recognize easily, that the approach of the vehicle component has been established on the basis of the closure of the electrical circuit. The sensor device therefore has a particularly simple and heat-resistant structure, and may therefore be used particularly well in the hot zone of the vehicle production plant. Because of its particularly heat-resistant configuration, particularly dependable ascertainment of the arrangement of the vehicle component is possible by means of the sensor device in the hot zone. The sensor device may be used not only in vehicle construction but also in other fields of use. In particular, the sensor device is adapted to be used in temperature ranges of up to 250° C., in particular up to at most 220° C.

According to a further configuration of the invention, the magnet element is formed from samarium-cobalt, in particular from Sm2Co17. Samarium-cobalt is a particularly thermally stable magnetic material. By the magnet element being formed from samarium-cobalt, the magnet element is particularly highly suitable for use in the hot zone of the vehicle production plant.

According to a further configuration of the invention, the sensor device comprises a resetting device, which is adapted to reset the magnet element from the deflected position into the initial position. In this case, a resetting force provided by the resetting device is in particular less than a deflecting force triggered by the vehicle component on the magnet element, so that reliable actuation of the magnet element when the vehicle component approaches the magnet element may be ensured. The resetting device allows dependable repeated ascertainment of an approach of a vehicle component. Provision of the resetting device makes it possible for manual resetting and therefore regeneration of the sensor device to be unnecessary.

In this context, according to a further configuration of the invention the resetting device may comprise a magnetic element for resetting the magnet element with a magnetic force. This magnetic element may, for example, be a small iron body. Alternatively or in addition, the resetting device may comprise a spring device for resetting the magnet element with a spring force. By means of the magnetic element of the resetting device, the magnetic force may be formed with the magnet element, so that the magnet element can be reset from its deflected position into its initial position by means of the magnetic force. In this case, a magnetic force of the magnet element, formed with the magnetic element of the resetting device, is less than a magnetic force of the magnet element formed with the vehicle component when the vehicle component is arranged closer to the magnet element than the predetermined limit distance. In this way, triggering of the output of the signal by means of the output element of the sensor device when the vehicle component approaches the magnet element closer than the predetermined limit distance may be ensured. When the vehicle component moves away from the magnet element, reliable resetting of the magnet element into its initial position may be guaranteed because of the resetting device. Provision of the spring device allows particularly reliable repeated resetting of the magnet element from its deflected position into its initial position. In this case, a spring force of the spring device is selected in such a way that the magnetic force acting on the magnet element when the vehicle component approaches closer than the predetermined limit distance is greater than the spring force, so that reliable deflection of the magnet element when the vehicle component approaches the magnet element closer than the predetermined limit distance is guaranteed despite the application of the spring force to the magnet element. As soon as the vehicle component moves away from the magnet element further than the predetermined limit distance, the magnet element is reset into the initial position by means of the spring force provided by the spring device. By means of the sensor device, an approach of a vehicle component to the magnet element may therefore again be detected reliably. The resetting device comprising the magnetic element and the resetting device comprising the spring device may be used in high temperature ranges, so that the resetting device allows reliable resetting of the magnet element from its deflected position into its initial position when the sensor device is used in the hot zone.

According to a further configuration of the invention, the magnet element is held on an anchor point, about which the magnet element is to be tilted for the actuation between the initial position and the deflected position. The anchor point therefore provides a tilt axis for the magnet element, about which the magnet element is to be tilted for its actuation between the deflected position and the initial position. By means of the anchor point, a tilting movement of the magnet element as well as the initial position and the deflected position for the magnet element may be defined particularly precisely. By means of the precise definition of the tilting movement of the magnet element and of the initial position and the deflected position, a reliable reproducible repeated detection of respective approaches of vehicle components to the sensor device may be made possible. For example, the magnet element may be held on a holding arm which is fixed relative to a housing of the sensor device in such a way that it can be tilted about the anchor point.

In this context, the sensor device may in particular comprise a first plug element, which is adapted to be tilted together with the magnet element about the anchor point so that the first plug element can be brought into electrical contact with a second plug element for closure of the electrical circuit. This second plug element is in particular fixed in its position relative to the anchor point and in particular relative to a housing of the sensor device. A movement of the second plug element during the tilting of the magnet element about the anchor point is therefore prevented. By the tilting of the magnet element about the anchor point, the first plug element is therefore tilted together with the magnet element about the anchor point, so that the first plug element can be brought into engagement with the second plug element. When the magnet element is arranged in its initial position, the first plug element is arranged at a distance from the second plug element, so there is no electrical contact between the first plug element and the second plug element. When the magnet element is arranged in its deflected position, the first plug element bears electrically conductively on the second plug element, so that an electric current can flow through the first plug element and the second plug element. As a consequence of the bearing of the first plug element on the second plug element, electrical contact exists between the plug elements and the electrical circuit is in a closed state. The joint tilting of the first plug element with the magnet element about the anchor point ensures that the tilting of the magnet element from the initial position into the deflected position closes the electrical circuit by contacting of the first plug element with the second plug element. A situation in which the magnet element is actuated from its initial position into the deflected position without the electrical circuit being closed may therefore at least substantially be avoided.

According to a further configuration of the invention, electrical lines of the electrical circuit are formed from an energy supply chain-compatible high-temperature line. Because of the formation of the lines of the electrical circuit from a respective high-temperature line, the electrical circuit has a particularly high stability at high temperatures and is therefore particularly highly suitable for use in the hot zone of the vehicle production plant. Furthermore, the energy supply chain-compatible configuration of the high-temperature lines of the electrical circuit allows use of the high-temperature lines of the electrical circuit in an energy supply chain, which may also be referred to as a power chain. In this way, a relative movement of the sensor device within the vehicle production plant is made possible. For example, the sensor device may be configured to be movable relative to a belt on which the vehicle component is to be transported through the vehicle production plant. This provides a particularly high flexibility of the sensor device in respect of its mobility in the vehicle production plant.

According to a further configuration of the invention, metallic constituents of the sensor device are made from nonmagnetic metals or metal alloys. The magnetic element of the resetting device is an exception to this if the sensor device has the resetting device for resetting the magnet element with a magnetic force. The metallic constituents of the sensor device may, in particular, be made from brass and/or aluminum, or brass alloys and/or aluminum alloys and/or stainless steel alloys. In this way, the influence of metallic constituents of the sensor device on the actuation of the magnet element may be kept particularly low. Consequently, it can be guaranteed with particularly high dependability that the magnet element will be actuated from its initial position into its deflected position during the approach of the vehicle component closer to the sensor device than the predetermined limit distance.

The invention furthermore relates to an arrangement of a sensor device as already described in connection with the sensor device according to the invention in a hot zone of a production plant for vehicles, in particular motor vehicles. In this case, the sensor device is adapted in particular to detect an approach of a vehicle component of a vehicle, in particular of the motor vehicle, to the sensor device in the hot zone of the production plant. In this way, a position of the vehicle component in the production plant may be ascertained with particularly high reliability and particularly accurately, especially in extreme temperature zones of the production plant such as the hot zone. Advantages and advantageous developments of the sensor device according to the invention are to be regarded as advantages and advantageous developments of the arrangement according to the invention, and vice versa.

According to a further configuration of the invention, the sensor device is arranged in a dryer of a paint shop. In this dryer of the paint shop, painted vehicle components of the vehicle, in particular of motor vehicles, are dried, particularly in order to dry a paint applied onto the vehicle components. In this case, drying of the paint in question is carried out at particularly high temperatures, which may make the use of many sensors difficult or even impossible. The described use of the sensor device in the dryer of the paint shop allows reliable ascertainment of an approach of the respective vehicle components to the sensor device despite the high temperatures and therefore the use in the hot zone, so that a respective position of vehicle components in the dryer may be ascertained particularly reliably by means of the sensor device.

Further features of the invention may be found in the claims, the figures and the description of the figures. The features and feature combinations mentioned above in the description and the features and feature combinations mentioned below in the description of the figures and/or only shown in the figures may be used not only in the combination respectively indicated but also in other combinations or separately, without departing from the scope of the invention.

DETAILED DESCRIPTION OF THE DRAWINGS

In the figures, elements which are the same and functionally equivalent are provided with the same references.

Figure 1:
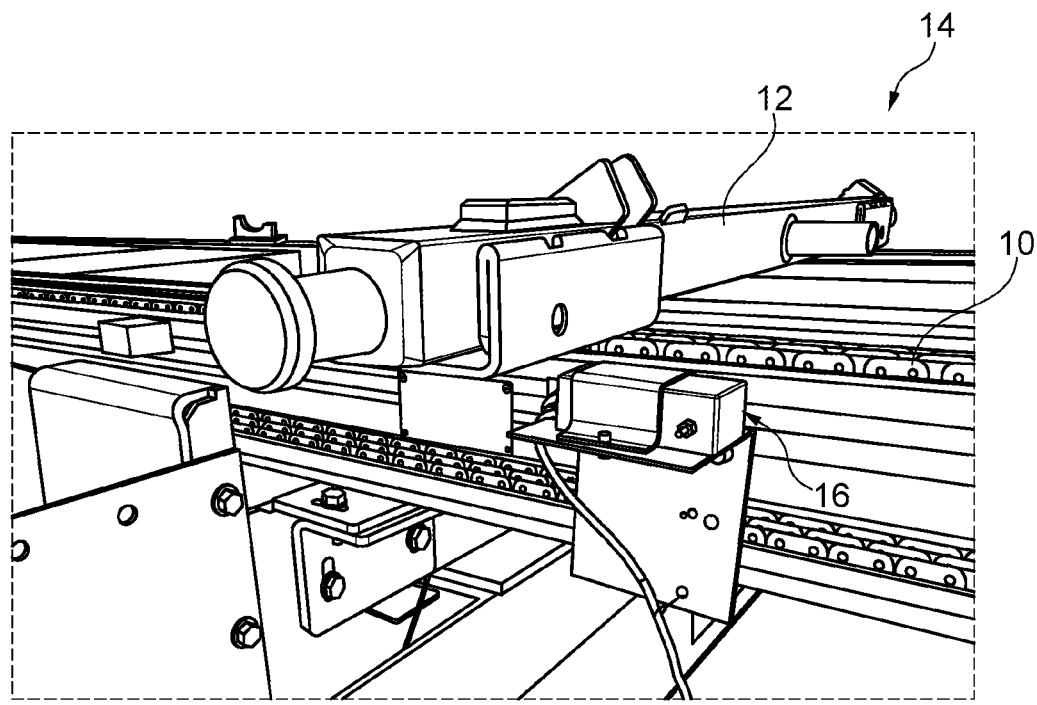
FIG. 1 shows a schematic perspective view of a detail of a dryer of a paint shop of a production plant for motor vehicles with a running belt, along which vehicle components can be transported through the dryer, at least one sensor device, by means of which an approach of the vehicle component to the sensor device can be established by means of magnetism, being arranged on the running belt, so that a position of the vehicle component in the dryer may be ascertained.
Figure 2:
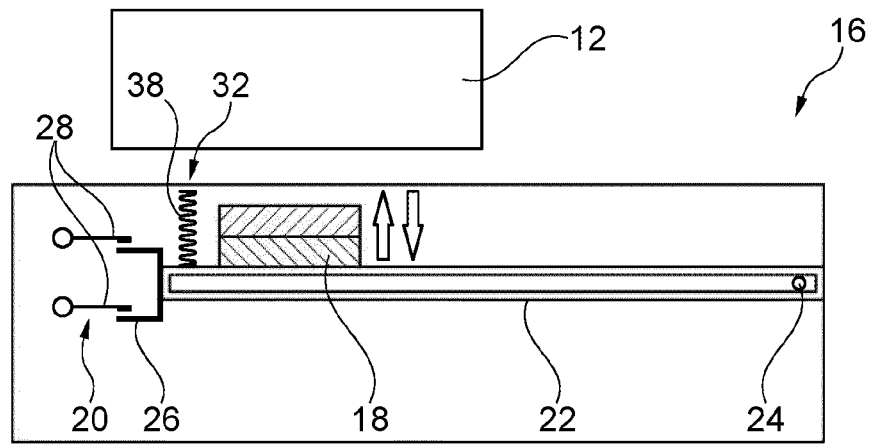
FIG. 2 shows a schematic internal view of a first embodiment of the sensor device, the sensor device comprising a magnet element which can be actuated between an initial position and a deflected position, and which is actuated from the initial position into the deflected position as a consequence of a magnetic force resulting between the vehicle component and the magnet element in the event of an approach of the vehicle component, and having an electrical circuit which is open when the magnet element is arranged in its initial position and is closed by actuation of the magnet element from the initial position into the deflected position, so that a current can flow in the electrical circuit.

FIG. 1 shows a perspective view of a transport belt 10 for motor vehicle components 12 in a dryer 14 of a paint shop of a vehicle production plant. During transport of the motor vehicle component 12 inside the dryer 14, the motor vehicle component 12 is transported in a so-called hot zone. In particular, the motor vehicle component 12 is transported through the dryer 14 by means of the transport belt 10. The motor vehicle component 12 is in the present case a bodywork crossmember. In order to be able to ascertain a position of the motor vehicle component 12 on the transport belt 10, at least one sensor device 16 is arranged in the dryer 14. By means of the sensor device 16, a presence of the motor vehicle component 12 may be established. In this case, the sensor device 16 is adapted to establish an approach of the motor vehicle component 12 closer than a predetermined limit distance. A schematic structure of the sensor device 16 in a first configuration is represented in FIG. 2, while a schematic structure of the sensor device 16 in a second configuration is shown in FIGS. 3 and 4.

In each configuration, the sensor device 16 comprises a magnet element 18 and an electrical circuit 20. The magnet element 18 is formed in the present case from samarium-cobalt, in particular Sm2Co17. In the present case, the magnet element 18 is held on a holding arm 22 which is mounted rotatably about an anchor point 24. The anchor point 24 therefore provides a tilting point for the holding arm 22. Together with the holding arm 22, the magnet element 18 held on the holding arm 22 is therefore tiltable about the anchor point 24. In this case, the magnet element 18 can be actuated from an initial position into a deflected position. In particular, the magnet element 18 is consequently actuatable from its initial position into its deflected position by a magnetic force resulting in the event of an approach of the vehicle component 12 to the magnet element 18. When the magnet element 18 is arranged in its initial position, the electrical circuit 20 is in an open state, as represented in FIG. 3. When the magnet element 18 is arranged in its deflected position, the electrical circuit 20 is in its closed state, as may be seen in FIG. 4.

The electrical circuit 20 comprises a first plug element 26 and a second plug element 28, which are adapted to be electrically contacted with one another for closure of the electrical circuit 20. In the present case, the plug element 26 is adapted to be tilted together with the magnet element 18 about the anchor point 24, so that for closure of the electrical circuit 20 the first plug element 26 is brought electrically into contact with the second plug element 28. For this purpose, as shown in the first embodiment in FIG. 2, the first plug element 26 may be fixed relative to the magnet element 18 by both the first plug element 26 and the magnet element 18 being held on the holding arm 22. In this case, the first plug element 26 is configured in particular as a two-pole plug which can be contacted with the second plug element 28, likewise configured as a two-pole plug.

Figure 3:
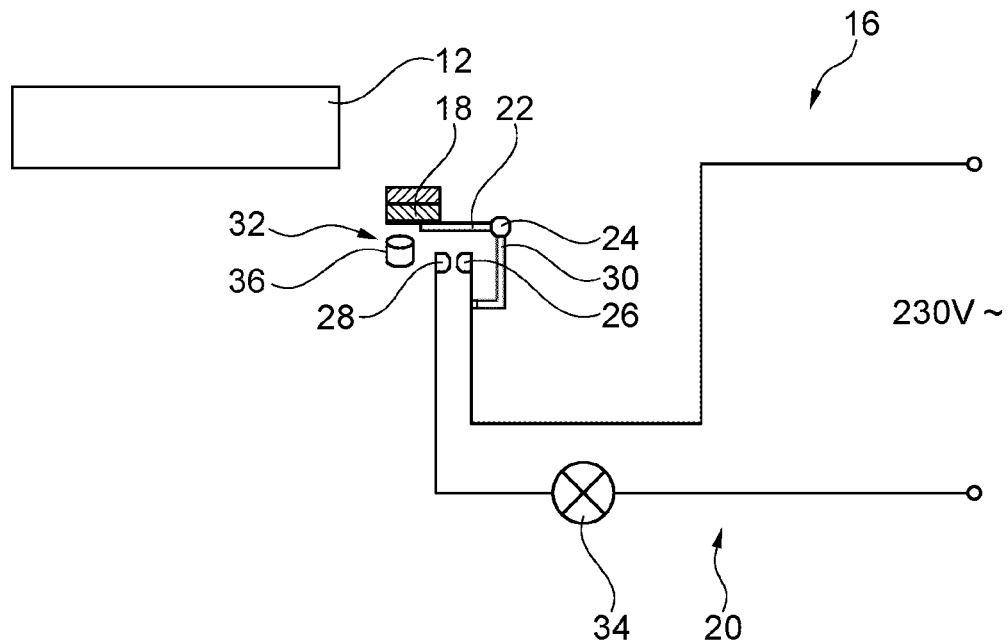
FIG. 3 shows a schematic functional view of the sensor device in a second embodiment, the magnet element being arranged in the initial position so that the electrical circuit is in an open configuration.
Figure 4:
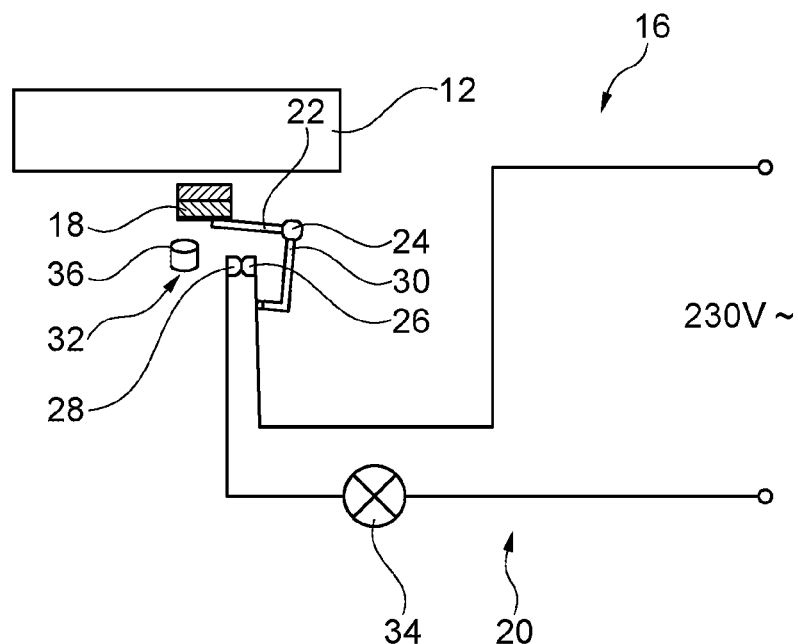
FIG. 4 shows a further schematic functional view of the sensor device according to FIG. 3, the magnet element being arranged in its deflected position so that the electrical circuit is closed.

As represented in FIGS. 3 and 4, according to a second embodiment of the sensor device 16 an actuation arm 30 may be connected tiltably about the anchor point 24 and rotationally fixed to the holding arm 22. This means that when the holding arm 22 is tilted about the anchor point 24, by means of the rotationally fixed connection of the actuation arm 30 to the holding arm 22 the actuation arm 30 is jointly tilted with the holding arm 22, in particular by the same angle, about the anchor point 24. By the actuation of the magnet element 18 from its initial position into its deflected position, the actuation arm 30 is therefore tilted about the anchor point 24. By means of the actuation arm 30, the first plug element 26 can be moved toward the second plug element 28 until the first plug element 26 bears on the second plug element 28 by the actuation arm 30 pressing the first plug element 26 toward the second plug element 28. As a result, an actuation movement of the magnet element 18 from its initial position into its deflected position results in the closure of the electrical circuit 20 by electrical contacting of the first plug element 26 with the second plug element 28.

In order to allow repeated detection of respective approaches of vehicle components 12 to the magnet element 18, the sensor device 16 may have a resetting device 32, as shown in FIG. 2. The resetting device 32 may also be provided in the second configuration of the sensor device 16 as shown in FIGS. 3 and 4. In the present case, the resetting device 32 comprises a spring device 38, in particular a spiral spring, by means of which the magnet element 18 can be reset from its deflected position into its initial position by means of a spring force. As an alternative to the configuration of the resetting device 32 shown in FIG. 2, the resetting device 32 may, as shown in FIGS. 3 and 4, comprise an actuatable iron element 36, in particular a screw, by means of which the magnet element 18 can be reset from its deflected position into its initial position by means of a magnetic force.

In order to be able to display particularly well the established approach of the vehicle component 12 to the magnet element 18, which has been ascertained, the sensor device 16 may have an output element 34 as shown in FIGS. 3 and 4. In the present case, the output element 34 comprises a light source. The output element 34 is adapted to output a signal which characterizes the ascertained approach of the vehicle component 12. In this case, the output element 34 outputs the signal when the electrical circuit 20 is closed. If the electrical circuit 20 is in an open state, the signal is not output by means of the output element 34.

The sensor device 16 is adapted to establish an approach of an iron object. By means of the sensor device 16, it is possible to ascertain whether the vehicle component 12 is located on the conveyor belt 10, or in particular at which position on the conveyor belt 10 the vehicle component 12 is located. In order to avoid vitiation of the detection of the iron object, metallic constituents of the sensor device 16, in particular a housing of the sensor device 16, may be made from nonmagnetic metals or metal alloys. Furthermore, for a particularly high thermal stability of the electrical circuit 20, respective lines of the electrical circuit 20 may be formed from a high-temperature line, in particular an energy supply chain-compatible high-temperature line. These lines are particularly stable and may be used particularly well especially in combination with conveyor belts 10. In the sensor device 16, respective component parts may be replaced individually in case of a fault.

Overall, the invention shows the way in which a contactless sensor for iron may be provided in a hot zone. This sensor is the described sensor device 16.

LIST OF REFERENCE CHARACTERS 10 conveyor belt
12 vehicle component
14 dryer
16 sensor device
18 magnet element
20 electrical circuit
22 holding arm
24 anchor point
26 first plug element
28 second plug element
30 actuation arm
32 resetting device
34 output element
36 iron element
38 spring device

The invention claimed is:

1. A sensor device for of a hot zone of a motor vehicle production plant, comprising:
    a magnet element, wherein the magnet element is actuatable from an initial position into a deflected position when a vehicle component of a motor vehicle approaches the magnet element;
    an electrical circuit, wherein the electrical circuit is open when the magnet element is arranged in the initial position and is closed when the magnet element is actuated from the initial position into the deflected position; and
    an output element, wherein the output element comprises a light source, wherein the light source outputs a signal characterizing an ascertained approach of the vehicle component of the motor vehicle when the electrical circuit is closed, and wherein the output of the signal provides a display that is recognizable by a person to indicate the ascertained approach of the vehicle component of the motor vehicle in the hot zone of the motor vehicle production plant.

2. The sensor device according to claim 1, wherein the magnet element is formed from Sm2Co17.

3. The sensor device according to claim 1, further comprising a resetting device, wherein the magnet element is resettable from the deflected position into the initial position by the resetting device.

4. The sensor device according to claim 3, wherein the resetting device comprises a magnetic element for resetting the magnet element with a magnetic force or wherein the resetting device comprises a spring device for resetting the magnet element with a spring force.

5. The sensor device according to claim 1, wherein the magnet element is held on an anchor point about which the magnet element is tiltable for actuation between the initial position and the deflected position.

6. The sensor device according to claim 5, further comprising a first plug element and a second plug element, wherein the first plug element is tiltable together with the magnet element about the anchor point such that the first plug element is electrically contactable with the second plug element for closure of the electrical circuit.

7. The sensor device according to claim 1, wherein electrical lines of the electrical circuit are formed from an energy supply chain-compatible high-temperature line.

8. The sensor device according to claim 1, wherein metallic constituents of the sensor device are made from nonmagnetic metals or metal alloys.

9. An arrangement, comprising:
    the sensor device according to claim 1 disposed in the hot zone of the motor vehicle production plant.

10. The arrangement according to claim 9, wherein the sensor device is disposed in a dryer of a paint shop.

* * * * *